United States Patent [19]

Hawrylo

[11] Patent Number: 4,540,450

[45] Date of Patent: Sep. 10, 1985

[54] INP:TE PROTECTIVE LAYER PROCESS FOR REDUCING SUBSTRATE DISSOCIATION

[75] Inventor: Frank Z. Hawrylo, Trenton, N.J.

[73] Assignee: The United States of America as represented by the Secretary of the Air Force, Washington, D.C.

[21] Appl. No.: 661,646

[22] Filed: Oct. 17, 1984

Related U.S. Application Data

[62] Division of Ser. No. 384,291, Jun. 2, 1982, abandoned.

[51] Int. Cl.$^3$ .......................................... H01L 23/208
[52] U.S. Cl. .................................... 148/171; 148/172; 148/173
[58] Field of Search ....................... 148/171, 172, 173; 357/61

[56] References Cited

U.S. PATENT DOCUMENTS

| 3,649,382 | 3/1972 | Hawrylo ............................. 148/171 |
| 3,753,801 | 8/1973 | Lockwood et al. ................. 148/171 |
| 3,950,195 | 4/1976 | Rode et al. ......................... 148/171 |
| 3,960,618 | 6/1976 | Kawamura et al. ................ 148/171 |
| 4,028,148 | 6/1977 | Horikoshi ........................... 148/171 |
| 4,050,964 | 9/1977 | Rode ................................... 148/171 |
| 4,233,090 | 11/1980 | Hawrylo et al. ..................... 148/171 |
| 4,263,064 | 4/1981 | Clawson et al. .................... 148/171 |
| 4,439,399 | 3/1984 | Hawrylo .......................... 148/171 X |

Primary Examiner—George T. Ozaki
Attorney, Agent, or Firm—Donald J. Singer; Stanton E. Collier

[57] ABSTRACT

In order to prevent the formation of indium droplets upon the surface of an indium phosphide wafer during liquid phase epitaxial growth, a doped protective layer is deposited by LPE upon said substrate before epitaxial growth of additional layers occurs. The doped protective layer is composed of indium phosphide doped with tellurium to a concentration of about high $10^{18}$ to low $10^{19}$.

6 Claims, 1 Drawing Figure

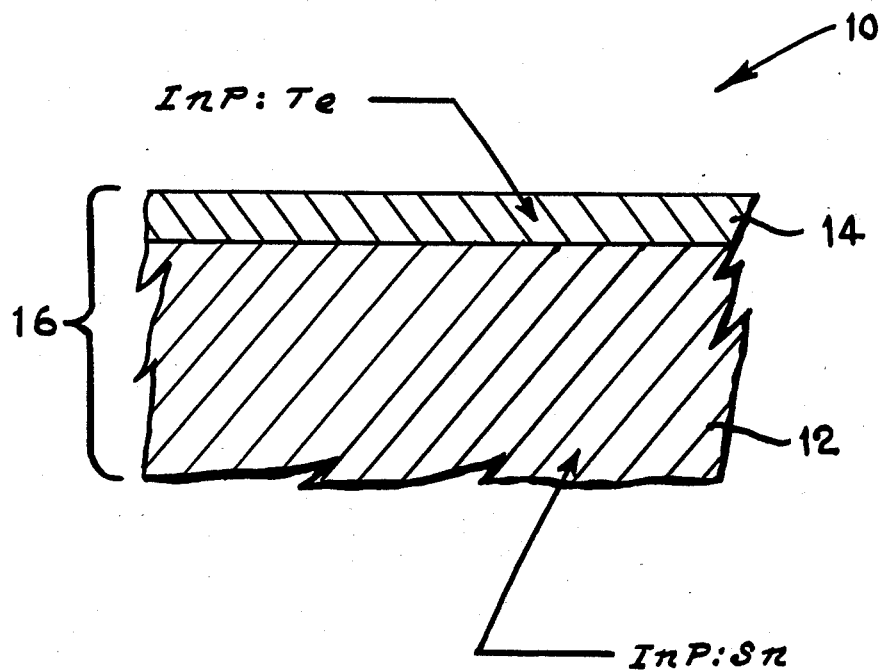

INP:TE PROTECTIVE LAYER PROCESS FOR REDUCING SUBSTRATE DISSOCIATION

STATEMENT OF GOVERNMENT INTEREST

The invention described herein may be manufactured and used by or for the Government for governmental purposes without the payment of any royalty thereon.

This is a division of application Ser. No. 384,291 filed June 2, 1982, now abandoned.

BACKGROUND OF THE INVENTION

This invention relates to the fabrication of semiconductor devices, and, more particularly, to the deposition of an epitaxial layer on the surface of an indium phosphide substrate.

The loss of phosphorus from the InP substrate surface, due to surface dissociation during the homogenization portion of the growth cycle using liquid phase epitaxy (LPE), results in the formation of indium droplets on the substrate surface. These droplets cause localized variations in the melt composition, especially when growing alloys such as InGaAsP, and further produce localized regions with solidus composition variations. The formation of these indium droplets is clearly counterproductive to the goal of having a substantially planar surface into which other semiconductor materials can be grown. As a result the surface of the InP is no longer smooth and planar, and any epitaxial layer grown thereon will both conform to the surface roughness and contain crytallographic defects which propagate from the damaged substrate surface. Almost all semiconductors require substrates and epitaxial layers thereon that are planar and defect-free as possible. Thus, these surfaces must be free of undesired surface roughness and defects so that quality semiconductor devices can be made therefrom.

A variety of methods have been attempted to eliminate indium droplets and the defects arising therefrom, such as placing an InP cover wafer over the InP substrate surface to prevent the phosphorus from vaporizing, using phosphine gas as shown in U.S. Pat. No. 4,263,064, entitled, "Method of Liquid Phase Epitaxial Growth", or using an indium wipe melt to clean the substrate. These methods work but either affect the growth process with other unwanted problems or do not substantially eliminate the indium droplets.

SUMMARY OF THE INVENTION

This invention places a protection layer of indium phosphide doped with tellurium on an indium phosphide substrate to substantially reduce indium droplets thereon and pitting caused by the dissociation of phosphorus from the InP substrate during the LPE technique.

The formation of this protective layer involves the forming of a melt solution of In, InP, and Te, homogenizing the melt solution, wiping the substrate with an indium solution, and depositing a layer of InP doped with Te upon the substrate after the indium wipe. After forming this protective layer upon the substrate, additional layers of semiconductor material are deposited to form an operable semiconductor device.

One object of this invention is to provide a substrate surface that is substantially free of defects such as indium droplets and pitting.

Another object of this invention is to provide a protective layer on a substrate to stop the dissociation of elements from the substrate.

Another object of this invention is to provide a method of forming a protective layer on the substrate.

These and many other objects of the present invention will be readily apparent to one skilled in the art to which the invention pertains from a perusal of the following detailed description and of the claims.

BRIEF DESCRIPTION OF THE DRAWINGS

The only FIGURE is a partial cross-section of two semiconductor layers of this invention.

DETAILED DESCRIPTION OF THE PREFERRED EMBODIMENT

Referring to the only FIGURE of the invention, a semiconductor device 10 shows a protective layer 14 of indium phosphide doped with tellurium deposited upon a first substrate 12 of indium phosphide doped with tin. In combination, layer 14 and first substrate 12 form a second substrate 16 upon which additional semiconductor materials can be deposited without the problems noted hereinabove.

Although various epitaxial techniques can be used for depositing protective layer 14, a preferred technique is by liquid phase epitaxy (LPE) using an apparatus similar to that described in U.S. Pat. No. 3,753,801 to H. F. Lockwood et al, entitled, "Method of Depositing Epitaxial Semiconductor Layers From the Liquid Phase", issued Aug. 21, 1973 and is incorporated herein by reference. Basically, the apparatus includes a furnace boat having a plurality of spaced bins having openings in the top surface and a substrate carrying slide which is movable through the furnace boat and across the bottom of each of the bins. Each of the bins can contain a liquid source of semiconductor material from which layers of material can be deposited.

For this particular application the first bin contains an almost pure indium source for wiping substrate 12 in preparation for depositing layer 14. The second bin contains the growth melt which consists of indium, indium phosphide, and tellurium. The slide contains a wafer of indium phosphide which forms first substrate 12.

Specifically, for one example, the growth melt consisted of 4.9955 grams of indium, 54.3 milligrams of indium phosphide, and 40.9 milligrams of tellurium. The growth melt was homogenized at about 664° C. for about one hour and then the temperature was lowered at a rate of 0.5° C. per minute until a temperature of about 645° C. was reached. At this point first substrate 12 was pulled through the first bin having the indium wipe solution therein. The wipe of first substrate 12 occurred in 15 seconds. After this wipe, the slide with first substrate 12 was pulled into the second bin with the growth melt noted above. The temperature started at about 645° C. and was lowered at a rate of 0.3° C. per minute until a temperature of 635° C. was reached in about 37 minutes. First substrate 12 was doped initially with tin but other dopants are acceptable and would not effect the purpose of this invention. After the growth melt deposited layer 14 by the supercooling technique, second substrate 16 was removed from the furnace. The resultant layer 14 was measured to be 10.8 micrometers thick with a concentration of tellurium of about high $10^{18}$ atoms per cubic centimeter having a measured lattice parameter of 5.87049 Angstroms. Photo luminescence of protective layer 14 was measured to be 8900 Angstroms.

In a second example, 20.4 milligrams of tellurium was used in the growth melt. A microprobe analysis of protective layer 14 indicated 0.05 atomic percent of tellurium in the indium phosphide solid. In a third example, 35.9 milligrams of the tellurium in the growth melt resulted in also a 0.05 atomic percent tellurium atoms in indium phosphide.

To test the effectiveness of protective layer 14 three different configurations are used: an indium phosphide cover wafer is placed over a wafer of InP doped with tin, a wafer of InP doped with tin having protective layer 14 of InP doped with tellurium, and a wafer of InP doped with tin having a protective layer 14 of InP doped with selenium, rather than tellurium. These wafers are placed in the boat and the temperature is cycled through the growth profile for 0° C. to 664° C. to 635° C. in about 2 hours. After cooling the furnace, the samples are removed and examined with an optical microscope.

The largest indium droplets occurred on the InP doped with selenium protective layer 14, smaller and less indium droplets on the InP doped with tin wafer, and no indium droplets on the InP doped with tellurium protective layer 14.

Thus InP doped with tellurium protective layer 14 can be used to fabricate buried dual heterojunction laser structures because the indium wipe melt is eliminated. This structure is generated by growing directly onto a striped configuration surface masked with silicon dioxide. Unfortunately, the present state of the art used employs an indium wipe melt which causes the stripe to fill-up with indium after melt back. The protective layer of InP with tellurium makes possible a direct pull-in of the striped surface into the final growth solution with no indium carryover.

Obviously, many modifications of the present invention are possible in light of the above teachings and it is understood that, within the scope of the disclosed inventive concept, the invention may be practical otherwise than specifically described.

What is claimed is:

1. An improved method of fabricating a semiconductor device having therein a plurality of layers, said semiconductor device having a substrate upon which said layers are operably deposited, said substrate consisting of Group III-V elements, wherein the improvement comprises the steps of:
   forming a growth melt of Group III, V and VI elements by liquid phase epitaxy;
   homogenizing said growth melt;
   forming a Group III wipe solution;
   wiping said substrate with said wipe solution;
   placing said substrate after being wiped in contact with said growth melt;
   depositing on said substrate a doped protective layer from said growth melt for preventing the dissociation of said substrate;
   removing from said growth melt said substrate with said doped protective layer thereon; and
   removing said substrate having said protective layer thereon from a growth furnace whereby said protective layer allows surface preparation for forming said semiconductor device thereafter.

2. A method as defined in claim 1 wherein said growth melt consists of indium, phosphorus, and tellurium.

3. A method as defined in claim 2 wherein the concentration of said tellurium ranges from about high $10^{18}$ to low $10^{19}$ atoms per cubic centimeter in said protective layer.

4. A method as defined in claim 1 wherein said homogenizing occurs at a temperature of about 665° C. for a period of about an hour.

5. A method as defined in claim 1 wherein said depositing of said doped protective layer is by supercooling in a temperature range of about 645° C. to about 635° C., said temperature lowered at a rate of about 0.3° C./min.

6. A method as defined in claim 1 wherein said homogenizing and depositing occur in a temperature range of about 665° C. to 635° C. for a period of about two hours.

* * * * *